United States Patent
Pal et al.

(10) Patent No.: US 10,892,665 B2
(45) Date of Patent: Jan. 12, 2021

(54) VARIABLE SPEED CONSTANT FREQUENCY (VSCF) GENERATOR SYSTEM

(71) Applicant: HAMILTON SUNDSTRAND CORPORATION, Charlotte, NC (US)

(72) Inventors: Debabrata Pal, Hoffman Estates, IL (US); John Huss, Roscoe, IL (US); Mark W. Metzler, Davis, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 363 days.

(21) Appl. No.: 15/917,163

(22) Filed: Mar. 9, 2018

(65) Prior Publication Data
US 2019/0280564 A1    Sep. 12, 2019

(51) Int. Cl.
| | |
|---|---|
| *H02K 11/33* | (2016.01) |
| *H02K 9/19* | (2006.01) |
| *H02P 9/02* | (2006.01) |
| *H05K 7/20* | (2006.01) |
| *H02P 101/30* | (2015.01) |
| *H02K 9/22* | (2006.01) |

(52) U.S. Cl.
CPC ............. *H02K 9/19* (2013.01); *H02K 11/33* (2016.01); *H02P 9/02* (2013.01); *H05K 7/20254* (2013.01); *H02K 9/22* (2013.01); *H02P 2101/30* (2015.01)

(58) Field of Classification Search
CPC . H02K 11/33; H02K 9/06; H02K 9/14; H02K 9/19
See application file for complete search history.

(56) References Cited

U.S. PATENT DOCUMENTS

| | | | | |
|---|---|---|---|---|
| 5,034,638 | A | * | 7/1991 | McCabria ............... H02K 9/19 310/54 |
| 8,686,609 | B2 | * | 4/2014 | Furthmueller ....... H02K 11/046 310/68 D |
| 2007/0000231 | A1 | | 1/2007 | Otsuka et al. |
| 2007/0051490 | A1 | | 3/2007 | Walter |

FOREIGN PATENT DOCUMENTS

| | | |
|---|---|---|
| EP | 2163761 A1 | 3/2010 |
| EP | 2507512 A1 | 10/2012 |
| EP | 2803855 A1 | 11/2014 |
| EP | 3279091 A1 | 2/2018 |
| JP | 2015146704 A | 8/2015 |

OTHER PUBLICATIONS

Search Report dated Jul. 17, 2019 in U381054EP, EP Application No. EP19160338, 8 pages.
European Office Action Application No. 19160338.0: dated Sep. 9, 2020; pp. 5.

* cited by examiner

*Primary Examiner* — Dang D Le
(74) *Attorney, Agent, or Firm* — Cantor Colburn LLP

(57) ABSTRACT

A variable speed, constant frequency (VSCF) generator system is provided and includes a generator portion, a first cooling circuit and a second cooling circuit. The generator portion includes a generator, electronics configured to control operations of the generator and a housing to house the generator and the electronics. The first cooling circuit is provided such that first fluid exiting the generator passes through a first cooling element prior to returning to the generator. The second cooling circuit is provided such that second fluid exiting the electronics passes through a second cooling element prior to being pumped back toward the electronics.

19 Claims, 5 Drawing Sheets

VARIABLE SPEED CONSTANT FREQUENCY (VSCF) GENERATOR SYSTEM

BACKGROUND

The following description relates to a variable speed constant frequency (VSCF) generator system and, more specifically, to a VSCF generator system having first and second cooling circuits.

VSCF generator systems are typically configured with a generator and electronics disposed in a same package. Cooling oil for the generator is used to cool the generator and to cool the electronics. The cooling oil temperature can be in the 60-105° C. range with nominal cooling oil temperature being about 65° C. At such cooling oil temperatures, the electronics operate at correspondingly high temperatures of 110-125° C. at nominal oil temperatures and with correspondingly limited reliability.

In addition, due to high temperature cycling from non-operating ambient conditions of 11-15° C. to operating conditions of 110-125° C., sensitive microprocessors or field programmable gate array (FPGA) components can exhibit reduced low cycle thermal fatigue life.

BRIEF DESCRIPTION

According to an aspect of the disclosure, a variable speed constant frequency (VSCF) generator system is provided and includes a generator portion, a first cooling circuit and a second cooling circuit. The generator portion includes a generator, electronics configured to control operations of the generator and a housing to house the generator and the electronics. The first cooling circuit is provided such that first fluid exiting the generator passes through a first cooling element prior to returning to the generator. The second cooling circuit is provided such that second fluid exiting the electronics passes through a second cooling element prior to being pumped back toward the electronics.

In accordance with additional or alternative embodiments, the electronics includes first and second cold plates which are receptive of the second fluid in parallel, VSCF main electronic components operably disposed on the first cold plate and VSCF converter regulator electronic components operably disposed on the second cold plate.

In accordance with additional or alternative embodiments, the first fluid includes oil and the first cooling element includes a fuel-cooled heat exchanger in which the oil is cooled by an aircraft fuel supply.

In accordance with additional or alternative embodiments, the first cooling circuit further includes an accessory mounting and drive (AMAD) element fluidly interposed between the generator and the fuel-cooled heat exchanger.

In accordance with additional or alternative embodiments, the second fluid exiting and being pumped back toward the electronics includes oil and the second cooling circuit includes an air-cooled heat exchanger assembly in which the oil is cooled by a supply of air and a pump fluidly interposed between the air-cooled heat exchanger assembly and the electronics.

In accordance with additional or alternative embodiments, the air cooled heat exchanger assembly includes an air-cooled heat exchanger, a first duct by which engine fan bypass air is directed toward the air-cooled heat exchanger, a second duct by which RAM air is directed toward the air-cooled heat exchanger and a controllable valve which is selectively controllable to permit the air-cooled heat exchanger to be receptive of one of the engine fan bypass air and the RAM air.

In accordance with additional or alternative embodiments, the second duct has sufficient capacity to supply the RAM air to the air-cooled heat exchanger and at least one additional heat exchanging component.

In accordance with additional or alternative embodiments, the VSCF generator system further includes a bypass circuit by which the second fluid is diverted from the second cooling circuit upstream from the second cooling element, flown through the first cooling element and directed back to the second cooling circuit downstream from the second cooling element a valve operably disposed along the bypass circuit to control an amount of the second fluid permitted to flow through the bypass circuit.

According to an aspect of the disclosure, an aircraft engine is provided and includes an exterior fan duct, an interior fan duct disposed within the exterior fan duct to define an annular region and a variable speed constant frequency (VSCF) generator system. The VSCF generator system includes a generator portion, a first cooling circuit and a second cooling circuit. The generator portion is disposed in a first section of the annular region and includes a generator, electronics configured to control operations of the generator and a housing to house the generator and the electronics. The first cooling circuit is provided such that first fluid exiting the generator passes through a first cooling element prior to returning to the generator. The second cooling circuit is provided such that second fluid exiting the electronics passes through a second cooling element disposed in a second section of the annular region prior to being pumped back toward the electronics.

In accordance with additional or alternative embodiments, the first section of the annular region is a lower annular region section and the second section of the annular region is an upper, off-center annular region section.

In accordance with additional or alternative embodiments, the electronics includes first and second cold plates which are receptive of the second fluid in parallel, VSCF main electronic components operably disposed on the first cold plate and VSCF converter regulator electronic components operably disposed on the second cold plate.

In accordance with additional or alternative embodiments, the first fluid includes oil and the first cooling element includes a fuel-cooled heat exchanger in which the oil is cooled by an aircraft fuel supply.

In accordance with additional or alternative embodiments, the first cooling circuit further includes an accessory mounting and drive (AMAD) element fluidly interposed between the generator and the fuel-cooled heat exchanger.

In accordance with additional or alternative embodiments, the second fluid exiting and being pumped back toward the electronics includes oil and the second cooling circuit includes an air-cooled heat exchanger assembly in which the oil is cooled by a supply of air and a pump fluidly interposed between the air-cooled heat exchanger assembly and the electronics.

In accordance with additional or alternative embodiments, the air cooled heat exchanger assembly includes an air-cooled heat exchanger, a first duct by which engine fan bypass air is directed toward the air-cooled heat exchanger, a second duct by which RAM air is directed toward the air-cooled heat exchanger and a controllable valve which is selectively controllable to permit the air-cooled heat exchanger to be receptive of one of the engine fan bypass air and the RAM air.

In accordance with additional or alternative embodiments, the second duct has sufficient capacity to supply the RAM air to the air-cooled heat exchanger and at least one additional heat exchanging component.

In accordance with additional or alternative embodiments, the aircraft further includes a bypass circuit by which the second fluid is diverted from the second cooling circuit upstream from the second cooling element, flown through the first cooling element and directed back to the second cooling circuit downstream from the second cooling element and a valve operably disposed along the bypass circuit to control an amount of the second fluid permitted to flow through the bypass circuit According to an aspect of the disclosure, a method of operating a variable speed constant frequency (VSCF) generator system is provided. The VSCF generator system includes a generator portion and a first cooling circuit. The generator portion includes a generator, electronics configured to control operations of the generator and a housing to house the generator and the electronics. The first cooling circuit is provided such that first fluid exiting the generator passes through a first cooling element prior to returning to the generator. The method includes pumping second fluid exiting the electronics along a second cooling circuit through a second cooling element and back toward the electronics and controlling the second cooling element to cool the second fluid using one of engine fan bypass air and RAM air in accordance with a current condition.

In accordance with additional or alternative embodiments, the controlling of the second cooling element includes positioning a controllable valve in one of an engine fan bypass air selection position and a RAM air selection position.

In accordance with additional or alternative embodiments, the method further includes diverting a controllable amount of the second fluid away from the second cooling circuit upstream from the second cooling element, flowing the controllable amount of the second fluid through the first cooling element and directing the controllable amount of the second fluid back to the second cooling circuit downstream from the second cooling element.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features and advantages of the disclosure are apparent from the following detailed description taken in conjunction with the accompanying drawings in which:

These and other advantages and features will become more apparent from the following description taken in conjunction with the drawings.

DETAILED DESCRIPTION

As will be described below, a variable speed constant frequency (VSCF) system is provided and operative to reduce component temperatures through the use of separate cooling loops whereby generator oil is fuel-cooled by fuel and oil for cooling electronics is air-cooled.

Figure 1:
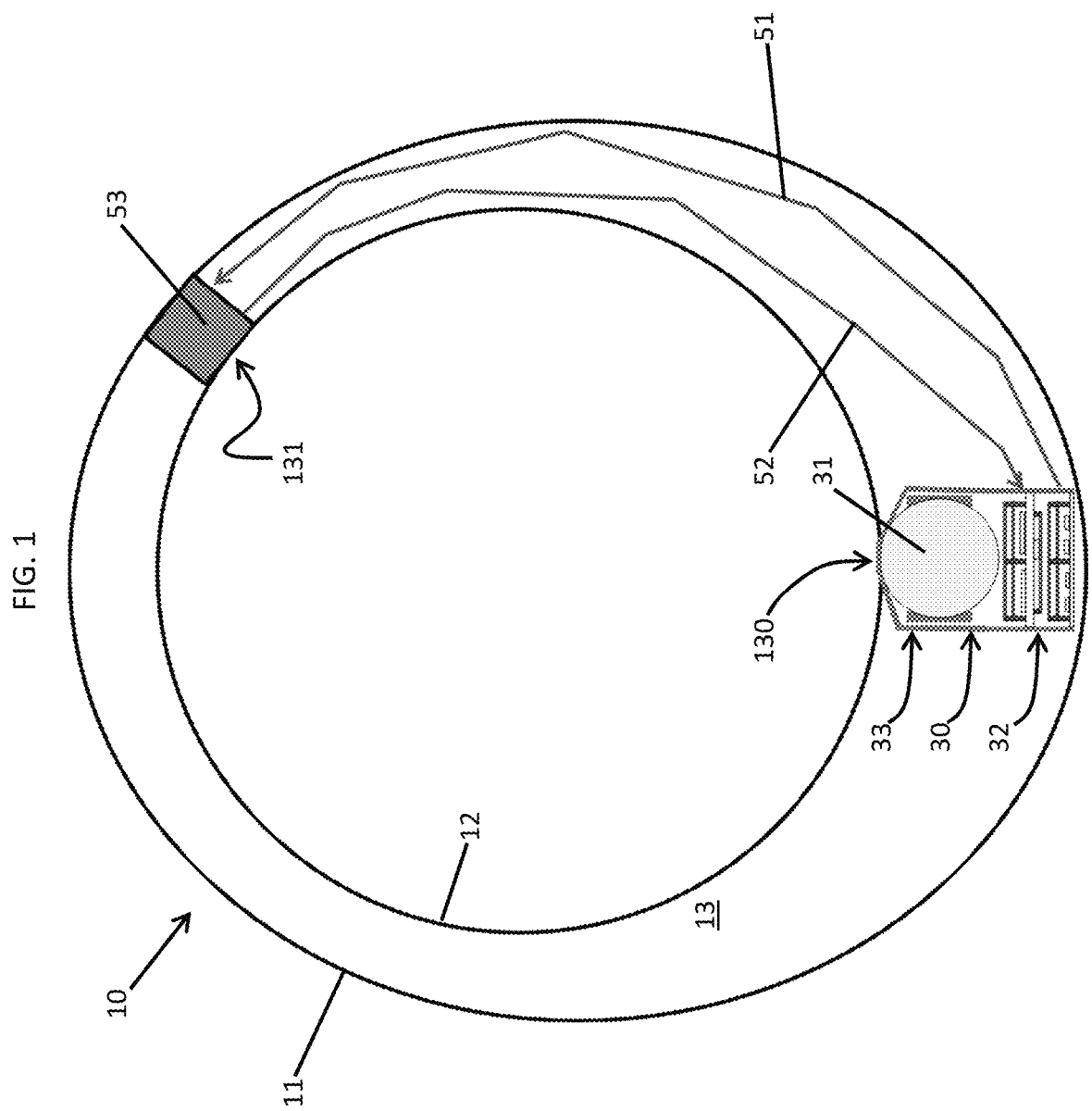
FIG. 1 is an axial view of an aircraft engine in accordance with embodiments.

With reference to FIG. 1, an aircraft engine 10 is provided and includes an exterior fan duct 11 and an interior fan duct 12. The interior fan duct 12 is disposed within the exterior fan duct 11 to define an annular region 13 between an exterior surface of the interior fan duct 12 and an interior surface of the exterior fan duct 11. The aircraft 10 further includes a variable speed constant frequency (VSCF) generator system 20 which is at least partially disposed within the annular region 13.

Figure 2:
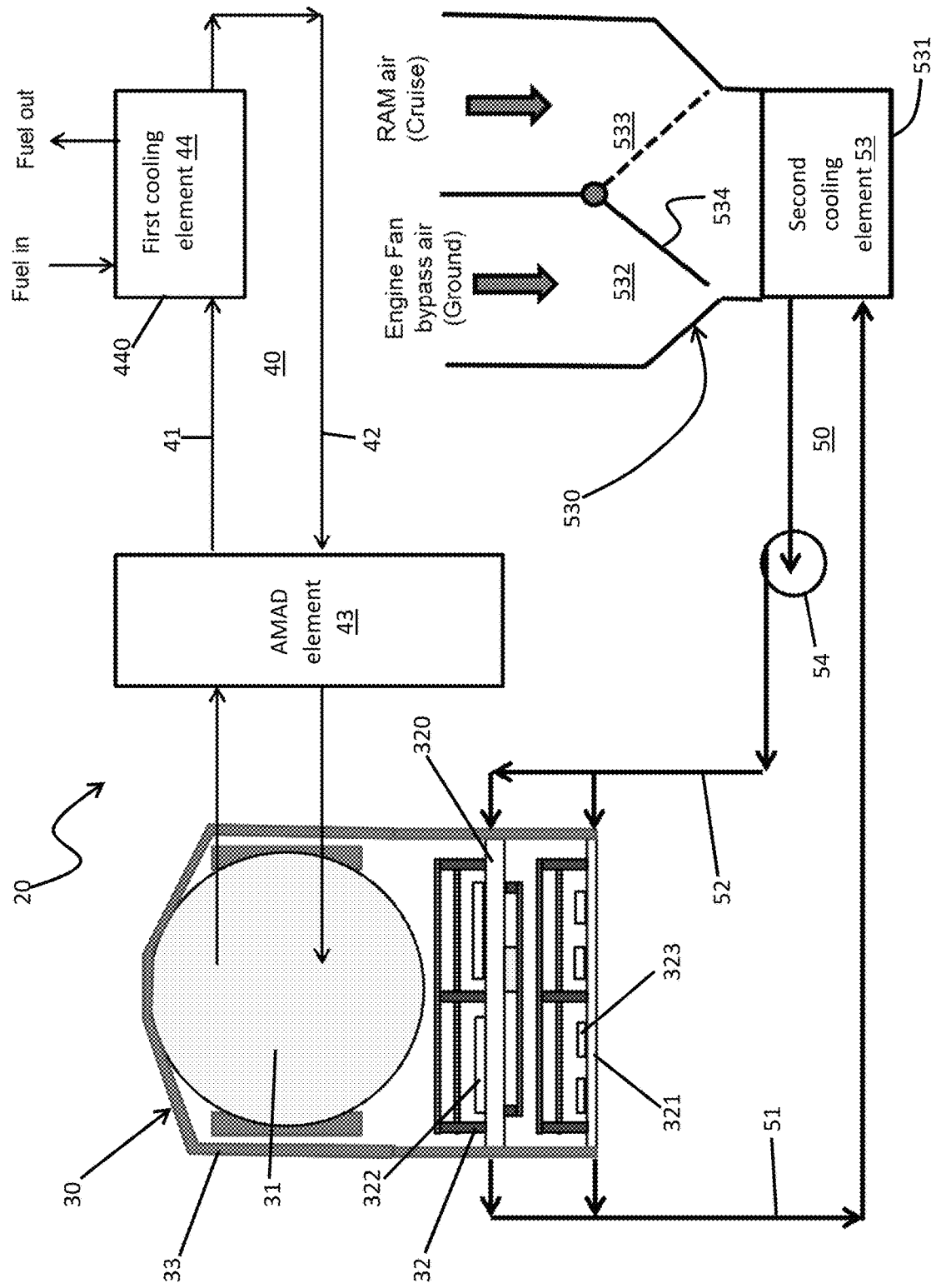
FIG. 2 is a schematic diagram of a variable speed constant frequency (VSCF) generator system in accordance with embodiments.

With continued reference to FIG. 1 and with additional reference to FIG. 2, the VSCF generator system 20 includes a generator portion 30, a first cooling circuit 40 and a second cooling circuit 50. The generator portion 30 is disposed in a first section 130 of the annular region 13 (e.g., a lower annular region section) and includes a generator 31, electronics 32 configured to control operations of the generator 31 and a housing 33. The housing 33 is a unitary feature and has a first housing section that is configured to house the generator 31 and a second housing section that is configured to house the electronics 32. The electronics 32 includes a first cold plate 320, a second cold plate 321, VSCF main electronic components 322 that are operably disposed on the first cold plate 320 and, in some cases, VSCF converter regulator electronic components 323 that are operably disposed on the second cold plate 321.

The first cooling circuit 40 includes first piping 41, second piping 42, an accessory mounting and drive (AMAD) element 43 and a first cooling element 44. The first cooling circuit 40 is provided such that first fluid (e.g., generator cooling oil or another suitable coolant) exiting the generator 31 passes along the first piping 41 through the AMAD element 43 to and through the first cooling element 44 prior to returning to the generator 31 through the AMAD element 43 along the second piping 42. The first cooling element 44 may include or be provided as a fuel-cooled heat exchanger 440 in which the first fluid is cooled by an aircraft fuel supply prior to returning to the generator 31.

The second cooling circuit 50 includes third piping 51, fourth piping 52, a second cooling element 53, which may be disposed in a second section 131 of the annular region 13 (e.g., an upper, off-center annular region section), and a pump element 54. The second cooling circuit 50 is provided such that second fluid (e.g., electronics cooling oil or another suitable coolant) exiting the first and second cold plates 320 and 321 of the electronics 32 passes along the third piping 51 to and through the second cooling element 53 prior to being pumped by the pump element 54 back toward the electronics 32 along the fourth piping 52 for reception by the first and second cold plates 320 and 321. The second cooling element 53 may include or be provided as an air-cooled heat exchanger assembly 530 in which the second fluid is cooled by a supply of air.

As shown in FIG. 2, the second cooling circuit 50 is generally separate from the first cooling circuit 40 at least to the extent that the first and second fluids are isolated and kept separate from one another.

In accordance with embodiments in which the second cooling element 53 includes or is provided as an air-cooled heat exchanger assembly 530, the air-cooled heat exchanger assembly 530 includes an air-cooled heat exchanger 531, a first duct 532 by which engine fan bypass air is directed toward the air-cooled heat exchanger 531, a second duct 533 by which RAM air is directed toward the air-cooled heat exchanger 530 and a controllable valve 534. The controllable valve 534 may include or be provided as a pivotal door or valve element and is selectively controllable to occupy either of two positions. In the first position, the controllable valve 534 permits the air-cooled heat exchanger 531 to be receptive of the engine fan bypass air from the first duct 532. In the second position the controllable valve 534 permits the air-cooled heat exchanger 531 to be receptive of the RAM air from the second duct 533.

Figure 3:
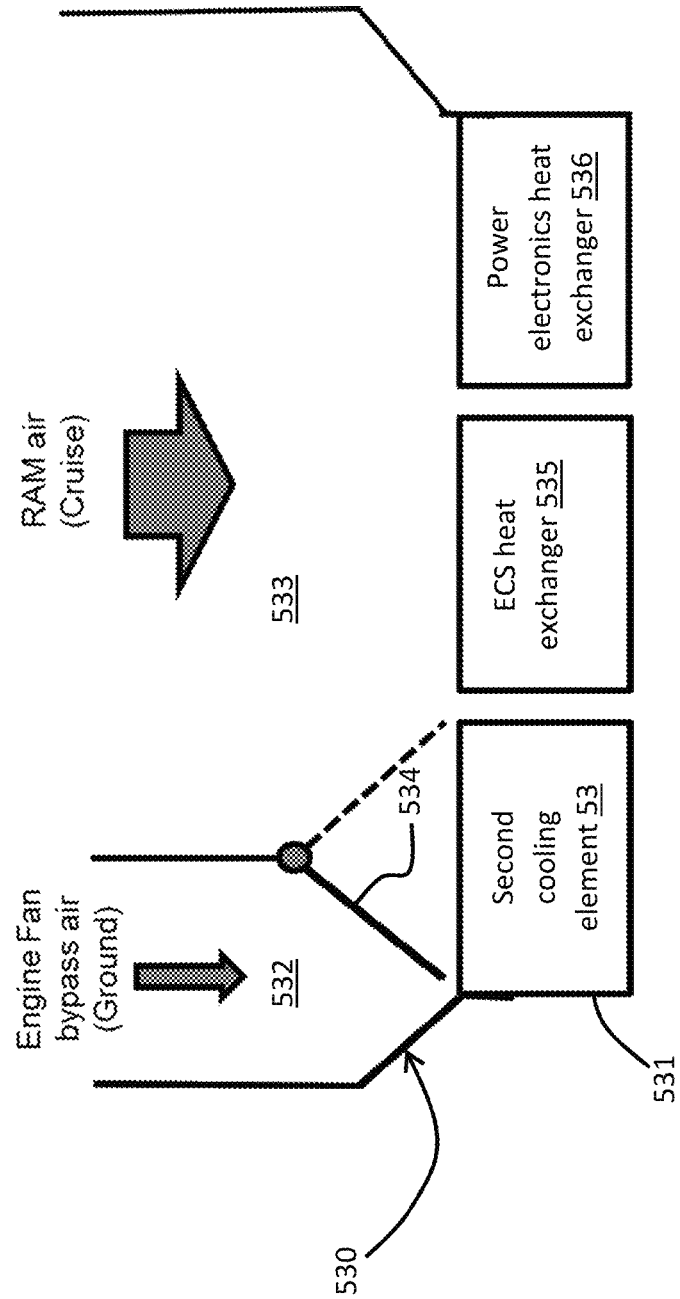
FIG. 3 is a schematic illustration of a portion of the VSCF generator system of FIG. 2.

In accordance with embodiments and with reference to FIG. 3, the second duct 533 may include or be provided as a scoop that is disposed within a RAM air circuit. This scoop may be sized to capture a sufficient quantity of air to satisfy the cooling requirements of the second fluid. In addition, the scoop may be enlarged to capture additional air to satisfy additional cooling requirements. For example, the scoop of the second duct 533 may be sized to capture a sufficient quantity of air to satisfy the cooling requirements of the second fluid and to additionally satisfy the cooling requirements of at least one of several other heat exchanger components. These other heat exchanger components may include, but are not limited to, an environmental control system (ECS) heat exchanger 535 and a power electronics heat exchanger 536.

Figure 4:
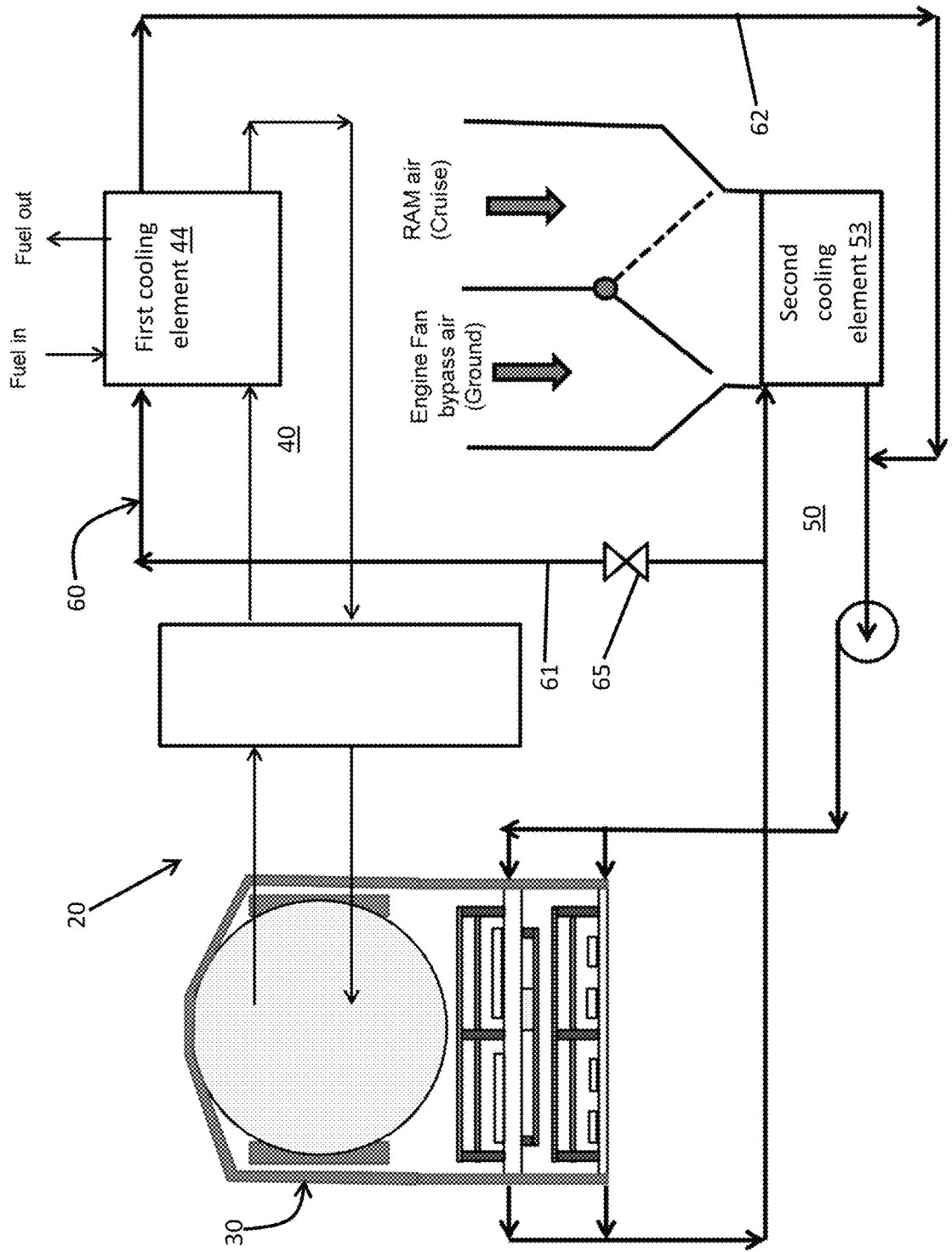
FIG. 4 is a schematic diagram of a variable speed constant frequency (VSCF) generator system in accordance with embodiments.

With reference to FIG. 4, the VSCF generator system 20 includes the generator portion 30, the first cooling circuit 40, the second cooling circuit 50 and may additionally include a bypass circuit 60 and a controllable bypass valve 65. The bypass circuit 60 includes fifth piping 61 and sixth piping 62. An amount of the second fluid is diverted from the second cooling circuit 50 at a location upstream from the second cooling element 53 and flown to and through the first cooling element 44 by the fifth piping 61. The amount of the second fluid is then directed back to the second cooling circuit 50 toward a location downstream from the second cooling element 53 by the sixth piping 62. The controllable bypass valve 65 may be disposed along the fifth piping 61 and is configured to control a magnitude of the amount of the second fluid that is diverted from the second cooling circuit 50 and permitted to flow through the bypass circuit 60.

In accordance with embodiments, the fifth piping 61 and the sixth piping 62 may maintain the second fluid in an isolated and separate condition with respect to the first fluid. In such cases, the first cooling element 44 may similarly maintain the first and second fluids in an isolated and separate condition whereby respective inlets and outlets for the first and second fluids at the first cooling element 44 are remote from one another. It is to be understood that this is not required, however, and that other embodiments exist in which the first and second fluids are permitted to mix within or at an exterior of the first cooling element 44.

In accordance with embodiments, the VSCF generator system 20 may also include a control element 70. The control element 70 may be provided as a stand-alone component or as a component of a flight control computer (FCC). In any case, the control element 70 may include a processing unit 71, a memory unit 72, a networking unit 73 and a servo control element 74. The networking unit 73 provides for communication between the processing unit 71 and various aircraft sensors and databases. The servo control element 74 is controllable by the processing unit 71 to operate at least one or all of the pump element 54, the controllable valve 534 and the controllable bypass valve 65. The memory unit 72 may have executable instructions stored thereon which are readable and executable by the processing unit 71. When these executable instructions are read and executed by the processing unit 71, the executable instructions cause the processing unit 71 to operate as described herein.

For example, the executable instructions may cause the processing unit 71 to determine that the electronics 32 require cooling from readings taken from local electronics sensors that are relayed to the processing unit 71 via the networking unit 73 and to instruct the servo control element 74 to activate the pump element 54 accordingly. As another example, the executable instructions may cause the processing unit 71 to determine whether a current flight condition is a grounded condition or a cruise condition from readings taken from flight sensors that are relayed to the processing unit 71 via the networking unit 73 and to instruct the servo control element 74 to operate the controllable valve 534 accordingly (i.e., to place the controllable valve 534 in the first position when the grounded condition is determined to be in effect such that the controllable valve 534 permits the air-cooled heat exchanger 531 to be receptive of the engine fan bypass air from the first duct 532 or to place the controllable valve 534 in the second position when the cruise condition is determined to be in effect such that the controllable valve 534 permits the air-cooled heat exchanger 531 to be receptive of the RAM air from the second duct 533). As yet another example, the executable instructions may cause the processing unit 71 to determine that an amount of the second fluid should be fuel-cooled from readings taken from local electronic sensors that are relayed to the processing unit 71 via the networking unit 73 and to instruct the servo control element 74 to operate the controllable bypass valve 65 accordingly.

Figure 6:
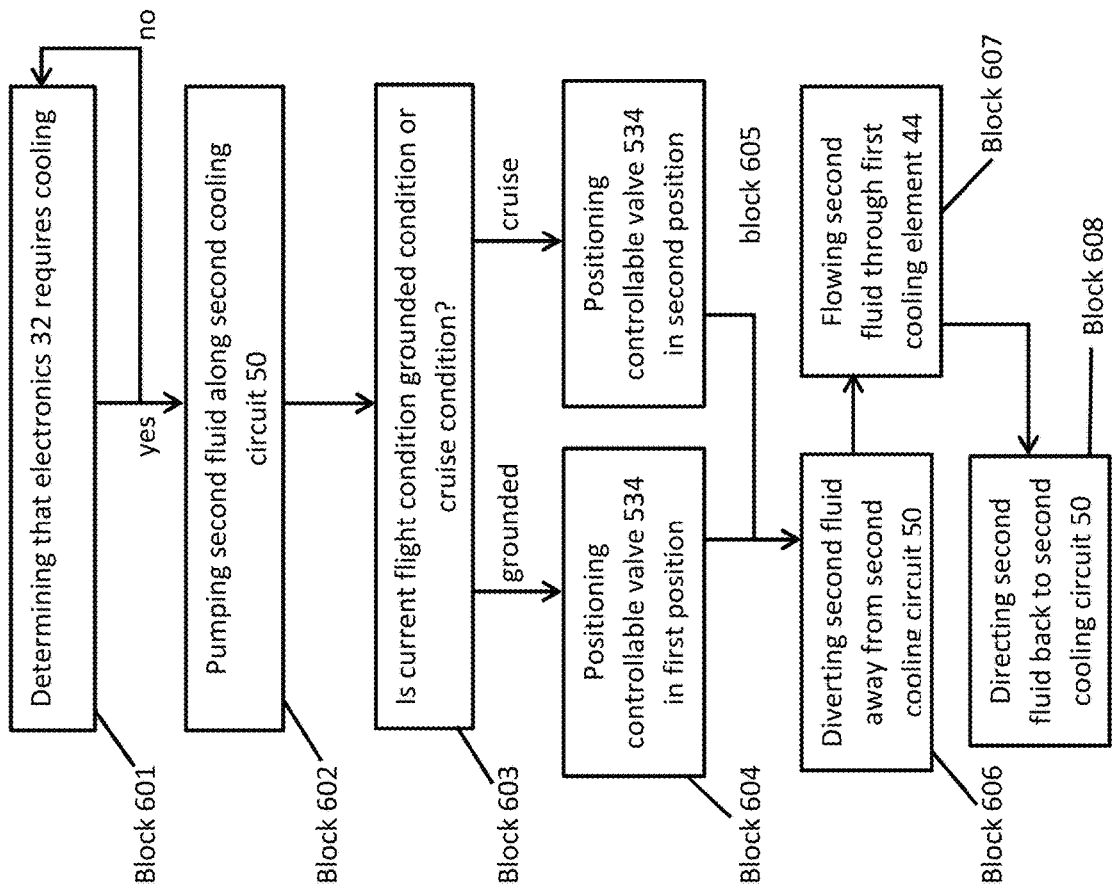
FIG. 6 is a flow diagram of a method of operating a VSCF generator system in accordance with embodiments.
Figure 5:
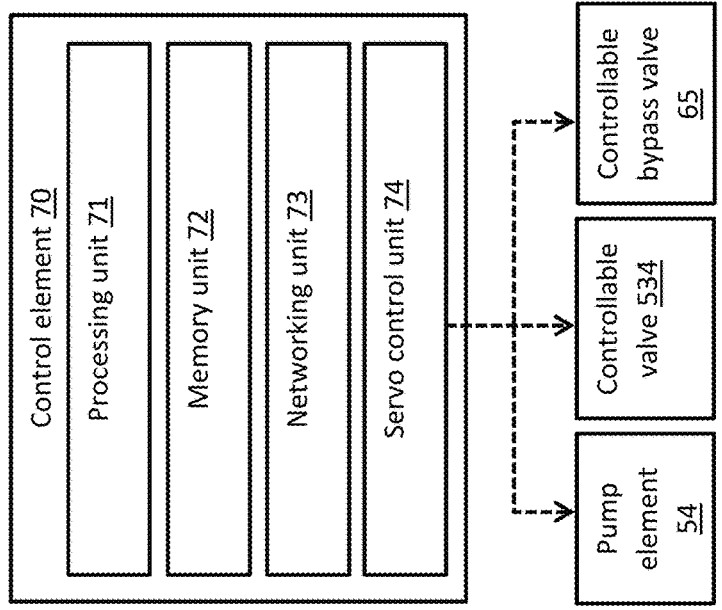
FIG. 5 is a schematic diagram illustrating a control element which is configured to control various operations of a VSCF generator system in accordance with embodiments.

With reference to FIG. 6, a method of operating the VSCF generator system 20 is provided. As shown in FIG. 6, the method includes determining that the electronics 32 requires cooling (block 601) and, if so, pumping the second fluid along the second cooling circuit 50 such that the second fluid passes through the second cooling element 53 and back toward the electronics 32 (block 602). The method further includes determining whether a current flight condition is a grounded condition or a cruise condition (block 603) and positioning the controllable valve 534 to assume the first position to thereby control the second cooling element 53 to cool the second fluid using engine fan bypass air from the first duct 532 during the grounded condition being in effect (block 604) or positioning the controllable valve 534 to assume the second position to thereby control the second cooling element 53 to cool the second fluid using RAM air from the second duct 533 during the cruise condition being in effect (block 605). In addition, in certain situations, the method may include diverting a controllable amount of the second fluid away from the second cooling circuit 50 upstream from the second cooling element 53 (block 606), flowing the controllable amount of the second fluid through the first cooling element 44 (block 607) and directing the controllable amount of the second fluid back to the second cooling circuit 50 downstream from the second cooling element 53 (block 608).

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A variable speed constant frequency (VSCF) generator system, comprising:
   a generator portion comprising a generator, electronics configured to control operations of the generator and a housing to house the generator and the electronics;
   a first cooling circuit by which first fluid exiting the generator passes through a first cooling element prior to returning to the generator; and
   a second cooling circuit by which second fluid exiting the electronics passes through a second cooling element prior to being pumped back toward the electronics, wherein the electronics comprises:
   first and second cold plates which are receptive of the second fluid in parallel;
   VSCF main electronic components operably disposed on the first cold plate; and
   VSCF converter regulator electronic components operably disposed on the second cold plate.

2. The VSCF generator system according to claim 1, wherein:
   the first fluid comprises oil, and
   the first cooling element comprises a fuel-cooled heat exchanger in which the oil is cooled by an aircraft fuel supply.

3. A variable speed constant frequency (VSCF) generator system, comprising:
   a generator portion comprising a generator, electronics configured to control operations of the generator and a housing to house the generator and the electronics;
   a first cooling circuit by which oil exiting the generator passes through a first cooling element prior to returning to the generator, wherein the first cooling element comprises a fuel-cooled heat exchanger in which the oil is cooled by an aircraft fuel supply; and
   a second cooling circuit by which second fluid exiting the electronics passes through a second cooling element prior to being pumped back toward the electronics,
   wherein the first cooling circuit further comprises an accessory mounting and drive (AMAD) element fluidly interposed between the generator and the fuel-cooled heat exchanger.

4. A variable speed constant frequency (VSCF) generator system, comprising:
   a generator portion comprising a generator, electronics configured to control operations of the generator and a housing to house the generator and the electronics;
   a first cooling circuit by which first fluid exiting the generator passes through a first cooling element prior to returning to the generator; and
   a second cooling circuit by which second fluid exiting the electronics passes through a second cooling element prior to being pumped back toward the electronics, wherein:
   the second fluid exiting and being pumped back toward the electronics comprises oil, and
   the second cooling circuit comprises an air-cooled heat exchanger assembly in which the oil is cooled by a supply of air and a pump fluidly interposed between the air-cooled heat exchanger assembly and the electronics.

5. The VSCF generator system according to claim 4, wherein the air-cooled heat exchanger assembly comprises:
   an air-cooled heat exchanger;
   a first duct by which engine fan bypass air is directed toward the air-cooled heat exchanger;
   a second duct by which RAM air is directed toward the air-cooled heat exchanger; and
   a controllable valve which is selectively controllable to permit the air-cooled heat exchanger to be receptive of one of the engine fan bypass air and the RAM air.

6. The VSCF generator system according to claim 5, wherein the second duct has sufficient capacity to supply the RAM air to the air-cooled heat exchanger and at least one additional heat exchanging component.

7. A variable speed constant frequency (VSCF) generator system, comprising:
   a generator portion comprising a generator, electronics configured to control operations of the generator and a housing to house the generator and the electronics;
   a first cooling circuit by which first fluid exiting the generator passes through a first cooling element prior to returning to the generator;
   a second cooling circuit by which second fluid exiting the electronics passes through a second cooling element prior to being pumped back toward the electronics;
   a bypass circuit by which the second fluid is diverted from the second cooling circuit upstream from the second cooling element, flown through the first cooling element and directed back to the second cooling circuit downstream from the second cooling element; and
   a valve operably disposed along the bypass circuit to control an amount of the second fluid permitted to flow through the bypass circuit.

8. An aircraft engine, comprising:
   an exterior fan duct;
   an interior fan duct disposed within the exterior fan duct to define an annular region; and
   a variable speed constant frequency (VSCF) generator system, comprising:
   a generator portion disposed in a first section of the annular region and comprising a generator, electronics configured to control operations of the generator and a housing to house the generator and the electronics;
   a first cooling circuit by which first fluid exiting the generator passes through a first cooling element prior to returning to the generator; and
   a second cooling circuit by which second fluid exiting the electronics passes through a second cooling element disposed in a second section of the annular region prior to being pumped back toward the electronics.

9. The aircraft engine according to claim 8, wherein:
   the first section of the annular region is a lower annular region section, and
   the second section of the annular region is an upper, off-center annular region section.

10. The aircraft engine according to claim 8, wherein the electronics comprises:
    first and second cold plates which are receptive of the second fluid in parallel;
    VSCF main electronic components operably disposed on the first cold plate; and VSCF converter regulator electronic components operably disposed on the second cold plate.

11. The aircraft engine according to claim 8, wherein:
the first fluid comprises oil, and
the first cooling element comprises a fuel-cooled heat exchanger in which the oil is cooled by an aircraft fuel supply.

12. The aircraft engine according to claim 11, wherein the first cooling circuit further comprises an accessory mounting and drive (AMAD) element fluidly interposed between the generator and the fuel-cooled heat exchanger.

13. The aircraft engine according to claim 8, wherein:
the second fluid exiting and being pumped back toward the electronics comprises oil, and
the second cooling circuit comprises an air-cooled heat exchanger assembly in which the oil is cooled by a supply of air and a pump fluidly interposed between the air-cooled heat exchanger assembly and the electronics.

14. The aircraft engine according to claim 13, wherein the air cooled heat exchanger assembly comprises:
an air-cooled heat exchanger;
a first duct by which engine fan bypass air is directed toward the air-cooled heat exchanger;
a second duct by which RAM air is directed toward the air-cooled heat exchanger; and
a controllable valve which is selectively controllable to permit the air-cooled heat exchanger to be receptive of one of the engine fan bypass air and the RAM air.

15. The aircraft engine according to claim 14, wherein the second duct has sufficient capacity to supply the RAM air to the air-cooled heat exchanger and at least one additional heat exchanging component.

16. The aircraft engine according to claim 8, further comprising:
a bypass circuit by which the second fluid is diverted from the second cooling circuit upstream from the second cooling element, flown through the first cooling element and directed back to the second cooling circuit downstream from the second cooling element; and
a valve operably disposed along the bypass circuit to control an amount of the second fluid permitted to flow through the bypass circuit.

17. A method of operating a variable speed constant frequency (VSCF) generator system, the VSCF generator system comprising:
a generator portion comprising a generator, electronics configured to control operations of the generator and a housing to house the generator and the electronics; and
a first cooling circuit by which first fluid exiting the generator passes through a first cooling element prior to returning to the generator,
the method comprising:
pumping second fluid exiting the electronics along a second cooling circuit through a second cooling element and back toward the electronics; and
controlling the second cooling element to cool the second fluid using one of engine fan bypass air and RAM air in accordance with a current condition.

18. The method according to claim 17, wherein the controlling of the second cooling element comprises positioning a controllable valve in one of an engine fan bypass air selection position and a RAM air selection position.

19. The method according to claim 17, further comprising:
diverting a controllable amount of the second fluid away from the second cooling circuit upstream from the second cooling element;
flowing the controllable amount of the second fluid through the first cooling element; and
directing the controllable amount of the second fluid back to the second cooling circuit downstream from the second cooling element.

* * * * *